United States Patent
Ajioka et al.

(10) Patent No.: US 8,460,853 B2
(45) Date of Patent: *Jun. 11, 2013

(54) PHOTOSENSITIVE RESIN COMPOSITION, PHOTOSENSITIVE ELEMENT, RESIST PATTERN MANUFACTURING METHOD, AND PRINTED CIRCUIT BOARD MANUFACTURING METHOD

(75) Inventors: Yoshiki Ajioka, Ibaraki (JP); Mitsuru Ishi, Ibaraki (JP); Junichi Iso, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 159 days.

This patent is subject to a terminal disclaimer.

(21) Appl. No.: 12/995,887

(22) PCT Filed: Apr. 24, 2009

(86) PCT No.: PCT/JP2009/058174
§ 371 (c)(1),
(2), (4) Date: Dec. 2, 2010

(87) PCT Pub. No.: WO2009/147913
PCT Pub. Date: Dec. 10, 2009

(65) Prior Publication Data
US 2011/0081616 A1    Apr. 7, 2011

(30) Foreign Application Priority Data
Jun. 2, 2008  (JP) .................. P2008-144947

(51) Int. Cl.
*G03F 7/00* (2006.01)
*G03F 7/004* (2006.01)
*G03F 7/028* (2006.01)

(52) U.S. Cl.
USPC ........... 430/270.1; 430/281.1; 430/286.1; 430/913; 430/311; 430/317

(58) Field of Classification Search
USPC ............ 430/270.1, 281.1, 286.1, 913, 311, 430/317
See application file for complete search history.

(56) References Cited

U.S. PATENT DOCUMENTS

| 4,917,977 A * | 4/1990 | Smothers ................. 430/1 |
| 5,334,484 A | 8/1994 | Minami et al. |
| 6,277,929 B1 * | 8/2001 | Kitahara et al. ....... 525/440.072 |
| 7,872,059 B2 * | 1/2011 | Sugasaki ................. 522/96 |
| 8,110,324 B2 * | 2/2012 | Fujimori et al. ............ 430/7 |

(Continued)

FOREIGN PATENT DOCUMENTS

| EP | 0503076 A1 | 9/1992 |
| JP | 53-013696 | 2/1978 |

(Continued)

OTHER PUBLICATIONS

Machine translation of JP 2004-144917 (no date).*
Office Action issued in corresponding Chinese Office Action on Jan. 18, 2012 (no translation available; submitted for certification).
International Search Report issued in corresponding application No. PCT/JP2009/058174 completed May 14, 2009 and mailed May 26, 2009.
International Preliminary Report on Patentability issued in the corresponding PCT application PCT/JP2009/058174 issued in Jan. 11, 2011 and mailed Jan. 20, 2011.

(Continued)

*Primary Examiner* — Amanda C. Walke
(74) *Attorney, Agent, or Firm* — Griffin & Szipl, P.C.

(57) ABSTRACT

A photosensitive resin composition comprising a (A) binder polymer, a (B) photopolymerizing compound having ethylenic unsaturated bonds in the molecule, a (C) photopolymerization initiator and a (D) polymerization inhibitor, wherein the (C) photopolymerization initiator comprises an acridine compound, and the content of the (D) polymerization inhibitor is 20-100 ppm by weight.

12 Claims, 1 Drawing Sheet

U.S. PATENT DOCUMENTS

| | | |
|---|---|---|
| 2003/0186166 A1 | 10/2003 | Fukaya et al. |
| 2004/0063025 A1 | 4/2004 | Natori et al. |
| 2008/0088813 A1* | 4/2008 | Takashima et al. ............. 355/67 |
| 2008/0194762 A1* | 8/2008 | Sugasaki ....................... 524/612 |
| 2009/0020944 A1 | 1/2009 | Ide et al. |

FOREIGN PATENT DOCUMENTS

| | | |
|---|---|---|
| JP | 60-7427 | 1/1985 |
| JP | 4-136942 | 5/1992 |
| JP | 2505637 B2 | 6/1996 |
| JP | 2004144917 A * | 5/2004 |
| JP | 2004-301996 | 10/2004 |
| JP | 2005-107191 | 4/2005 |
| JP | 2007-93796 | 4/2007 |

OTHER PUBLICATIONS

Search Report issued in counterpart European patent application 09758180.5 completed Jun. 29, 2011 and mailed Jul. 5, 2011.

Office Action issued in counterpart Korean application on Jul. 12, 2012 (no translation available; submitted for certification).

Notice of Allowance issued in counterpart Japanese application 2010-515808 on Jun. 26, 2012 (no translation available; submitted for certification).

* cited by examiner

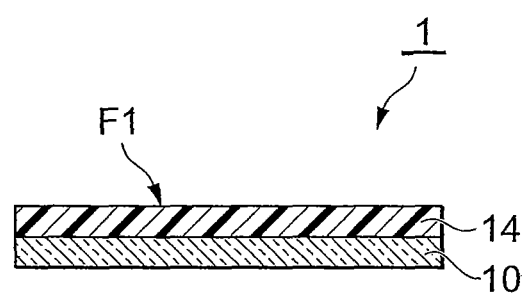

PHOTOSENSITIVE RESIN COMPOSITION, PHOTOSENSITIVE ELEMENT, RESIST PATTERN MANUFACTURING METHOD, AND PRINTED CIRCUIT BOARD MANUFACTURING METHOD

This is a National Phase Application in the United States of International Patent Application No. PCT/JP2009/058174 filed Apr. 24, 2009, which claims priority on Japanese Patent Application No. P2008-144947, filed Jun. 2, 2008. The entire disclosures of the above patent applications are hereby incorporated by reference.

TECHNICAL FIELD

The present invention relates to a photosensitive resin composition, and to a photosensitive element, a resist pattern manufacturing method and a printed circuit board manufacturing method, employing the same.

BACKGROUND ART

Resist materials used for etching, plating and the like in the field of manufacturing conventional printed circuit boards include widely employed photosensitive resin compositions and photosensitive elements obtained by laminating these onto supports and coating them with protective films.

When a photosensitive element is used for manufacture of a printed circuit board, first the photosensitive element is laminated onto a circuit-forming board such as a copper base and subjected to pattern exposure through a mask film or the like, after which the unexposed sections of the photosensitive element are removed with a developing solution to form a resist pattern. Next, the resist pattern is used as a mask for etching or plating of the circuit-forming board on which the resist pattern has been formed, in order to form a circuit pattern, and finally the cured sections of the photosensitive element are released and removed from the board to obtain a printed circuit board.

Recently, such printed circuit board manufacturing methods are implementing laser direct writing, whereby active light rays are directly irradiated as an image using digital data, without a mask film. YAG lasers, semiconductor lasers and the like are used as light sources for direct writing methods for their safety and handleability, and in recent years techniques using high-output gallium nitride-based blue lasers, which have long usable life, have been proposed.

Also recently, the direct writing method known as DLP (Digital Light Processing) exposure has been studied as a laser direct writing method that allows formation of finer patterns than in the past, for the increasingly high definitions and high densities of semiconductor package printed circuit boards. Generally speaking, DLP exposure uses active light rays with a wavelength of 390-430 nm, with a violet semiconductor laser as the light source. For general purpose printed circuit boards there are mainly used exposure methods that employ polygon multibeams with wavelengths of 355 nm from a YAG laser light source, which are suitable for small-batch, multi-variety products.

Several types of sensitizing agents are used in photosensitive resin compositions to match the different wavelengths of light sources in laser direct writing methods (see Patent documents 1 and 2, for example).

CITATION LIST

Patent Literature

[Patent document 1] Japanese Unexamined Patent Application Publication No. 2004-301996

[Patent document 2] Japanese Unexamined Patent Application Publication No. 2005-107191

SUMMARY OF INVENTION

Technical Problem

Direct writing methods wherein exposure is accomplished by high-speed movement of a laser have less exposure energy per spot and lower production efficiency, compared to conventional exposure methods involving one-time exposure using a light source that effectively emits ultraviolet rays, such as a carbon arc lamp, mercury vapor arc lamp, ultra-high-pressure mercury lamp, high-pressure mercury lamp or xenon lamp. In laser direct writing, therefore, a photosensitive resin composition with higher photosensitivity is required since the photosensitivity cannot be considered sufficient even with a photosensitive resin composition comprising a sensitizing agent such as described in Patent documents 1 and 2 mentioned above.

However, increasing the amount of photoinitiator or sensitizing agent added to the photosensitive resin composition, for the purpose of improving photosensitivity, promotes photoreaction locally on the top section of the photosensitive resin composition layer and lowers the curability of the bottom section, thus impairing the resist shape that is obtained after photocuring. Specifically, it creates problems such as an inverted trapezoid shape for the cross-sectional shape of the resist pattern, or jagged edges of the resist skirt, known as "mouse bites". When the cross-sectional shape of the resist pattern is an inverted trapezoid, inconveniences occur such as inability to obtain a wiring pattern with the design width after etching or plating treatment, or inability to obtain the desired adhesiveness for the resist pattern. Other problems that can occur include jagged edges of the resist skirt, known as mouse bites, and inconveniences such as loss of the wiring pattern. A photosensitive resin composition that does not cause such inconveniences is therefore desired.

Generally, improving the photosensitivity and resist pattern adhesiveness results, in turn, in the problem of reduced resolution. With such a conventional photosensitive resin composition, it has been difficult to satisfy all of the desired conditions including photosensitivity, resolution, adhesiveness of the formed resist pattern, and resist shape.

The present invention has been accomplished in consideration of these problems, and its object is to provide a photosensitive resin composition that satisfies all of the desired conditions including photosensitivity, resolution, adhesiveness of the formed resist pattern and resist shape, as well as a photosensitive element, a resist pattern manufacturing method and resist pattern manufacturing method that employ it, and a printed circuit board manufacturing method.

Solution to Problem

In order to achieve the object stated above, the invention provides a photosensitive resin composition comprising a (A) binder polymer, a (B) photopolymerizing compound having ethylenic unsaturated bonds in the molecule, a (C) photopolymerization initiator and a (D) polymerization inhibitor, wherein the (C) photopolymerization initiator comprises an acridine compound and the content of the (D) polymerization inhibitor is 20-100 ppm by weight.

The photosensitive resin composition of the invention having the construction described above satisfies all of the desired conditions including photosensitivity, resolution, adhesiveness of the formed resist pattern, and resist shape.

The acridine compound in the photosensitive resin composition of the invention preferably comprises a compound represented by the following formula (I). This will improve the resolution of the photosensitive resin composition and the adhesiveness of the formed resist pattern, while also resulting in a more satisfactory formed resist shape.

[Chemical Formula 1]

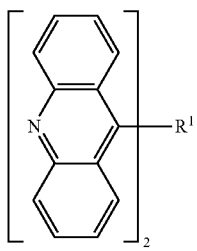

(I)

[In formula (I), $R^1$ represents a C2-20 alkylene, oxadialkylene or thiodialkylene group.]

The (B) photopolymerizing compound having ethylenic unsaturated bonds in the molecule in the photosensitive resin composition of the invention preferably comprises a compound represented by the following formula (II). This will still further improve the photosensitivity and resolution of the photosensitive resin composition.

or a hydroxyl group, and k represents an integer of 0-4. When k is 2 or greater, the multiple $R^6$ groups may be the same or different.]

The (D) polymerization inhibitor in the photosensitive resin composition of the invention preferably comprises a compound having a phenolic hydroxyl group. This will still further improve the photosensitivity of the photosensitive resin composition.

The invention also provides a photosensitive element comprising a support and a photosensitive resin composition layer composed of the photosensitive resin composition described above, formed on the support.

The photosensitive element of the invention is provided with a photosensitive resin composition layer comprising the photosensitive resin composition described above, and therefore has a satisfactory formed resist shape and allows excellent photosensitivity to be obtained.

The invention further provides a resist pattern manufacturing method that comprises a lamination step in which a photosensitive resin composition layer composed of the photosensitive resin composition described above is laminated on a circuit-forming board, an exposure step in which prescribed sections of the photosensitive resin composition layer are irradiated with active light rays for photocuring of the exposed sections, and a developing step in which the sections other than the exposed sections of the photosensitive resin composition layer are removed from the circuit-forming board to form a resist pattern.

[Chemical Formula 2]

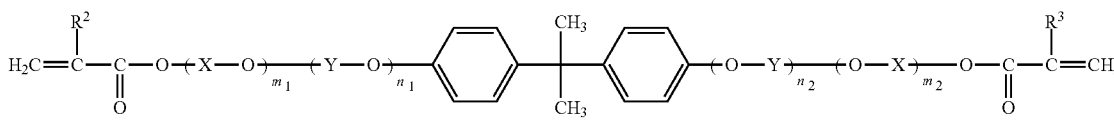

(II)

[In formula (II), $R^2$ and $R^3$ each independently represent hydrogen atom or a methyl group, X and Y each independently represent a C1-6 alkylene group, and $m_1$, $m_2$, $n_1$ and $n_2$ represent integers of 0-20 selected so that $m_1+m_2+n_1+n_2=0-40$.]

The (B) photopolymerizing compound having ethylenic unsaturated bonds in the molecule in the photosensitive resin composition of the invention preferably comprises a compound represented by the following formula (III). This will still further improve the photosensitivity of the photosensitive resin composition.

[Chemical Formula 3]

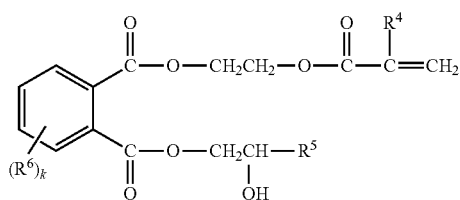

(III)

[In formula (III), $R^4$ represents hydrogen atom or a methyl group, $R^5$ represents hydrogen atom or a methyl or halogenated methyl group, $R^6$ represents C1-6 alkyl, a halogen atom The invention still further provides a resist pattern manufacturing method that comprises a lamination step in which a photosensitive resin composition layer composed of the photosensitive resin composition layer of the aforementioned photosensitive element is laminated on a circuit-forming board, an exposure step in which prescribed sections of the photosensitive resin composition layer are irradiated with active light rays for photocuring of the exposed sections, and a developing step in which the sections other than the exposed sections of the photosensitive resin composition layer are removed from the circuit-forming board to form a resist pattern.

According to the resist pattern manufacturing method of the invention, it is possible to efficiently form a resist pattern having a satisfactory resist shape, because the photosensitive resin composition or photosensitive element described above are used.

The invention still further provides a resist pattern manufacturing method wherein the exposure step is a step in which the photosensitive resin composition layer is subjected to direct writing exposure with laser light for photocuring of the exposed sections.

This resist pattern manufacturing method can more efficiently form a resist pattern having a satisfactory resist shape, because exposure by a laser direct writing method is carried out using a photosensitive resin composition or photosensitive element as described above.

The invention still further provides a printed circuit board manufacturing method which comprises a step of etching or plating the circuit-forming board on which a resist pattern has been formed by the manufacturing method described above.

Since a resist pattern is formed by the aforementioned resist pattern manufacturing method in the printed circuit board manufacturing method of the invention, it is possible to efficiently produce printed circuit boards and realize higher wiring densities.

Advantageous Effects of Invention

According to the invention it is possible to provide a photosensitive resin composition that satisfies all of the desired conditions including photosensitivity, resolution, adhesiveness of the formed resist pattern and resist shape, as well as a photosensitive element, a resist pattern manufacturing method and resist pattern manufacturing method that employ it, and a printed circuit board manufacturing method.

BRIEF DESCRIPTION OF DRAWINGS

FIG. 1 is a schematic cross-sectional view showing a preferred embodiment of a photosensitive element of the invention.

EXPLANATION OF SYMBOLS

1: Photosensitive element, 10: support, 14: photosensitive resin composition layer.

DESCRIPTION OF EMBODIMENTS

The invention will now be explained in detail. The term "(meth)acrylic acid" as used with regard to the invention means acrylic acid or its corresponding methacrylic acid, "(meth)acrylate" means acrylate or its corresponding methacrylate, and "(meth)acryloyl group" means acryloyl or its corresponding methacryloyl group.

The photosensitive resin composition of the invention comprises a (A) binder polymer (hereunder referred to as "component (A)"), a (B) photopolymerizing compound having ethylenic unsaturated bonds in the molecule (hereunder referred to as "component (B)"), a (C) photopolymerization initiator (hereunder referred to as "component (C)") and a (D) polymerization inhibitor (hereunder referred to as "component (D)").

Examples for the (A) binder polymer include acrylic-based resins, styrene-based resins, epoxy-based resins, amide-based resins, amide/epoxy-based resins, alkyd-based resins and phenol-based resins. Acrylic-based resins are preferred from the viewpoint of the alkali developing property. These may be used alone or in combinations of two or more.

The (A) binder polymer may be produced, for example, by radical polymerization of a polymerizable monomer. Examples of such polymerizable monomers include styrene, polymerizable styrene derivatives substituted at the α-position or on the aromatic ring such as vinyltoluene, α-methylstyrene and p-methylstyrene, acrylamides such as diacetoneacrylamide, acrylonitrile, vinyl alcohol esters such as vinyl-n-butyl ether, alkyl(meth)acrylate esters, benzyl(meth) acrylate ester, tetrahydrofurfuryl(meth)acrylate ester, dimethylaminoethyl(meth)acrylate ester, diethylaminoethyl (meth)acrylate ester, glycidyl(meth)acrylate ester, 2,2,2-trifluoroethyl(meth)acrylate, 2,2,3,3-tetrafluoropropyl(meth) acrylate, (meth)acrylic acid, α-bromo(meth)acrylic acid, α-chlor(meth)acrylic acid, β-furyl(meth)acrylic acid, β-styryl(meth)acrylic acid, maleic acid, maleic acid monoesters such as maleic anhydride, monomethyl malate, monoethyl malate and monoisopropyl malate, and fumaric acid, cinnamic acid, α-cyanocinnamic acid, itaconic acid, crotonic acid, propiolic acid and the like. These may be used alone or in combinations of two or more.

Examples of alkyl(meth)acrylate esters include compounds represented by the following formula (IV), and the same compounds with the alkyl groups substituted with hydroxyl groups, epoxy groups, halogen atoms or the like. Examples of C1-12 alkyl groups represented by $R^8$ in the following formula (IV) include methyl, ethyl, propyl, butyl, pentyl, hexyl, heptyl, octyl, nonyl, decyl, undecyl, dodecyl and their structural isomers.

In formula (IV), $R^7$ represents hydrogen atom or a methyl group, and $R^8$ represents a C1-12 alkyl group, preferably a C1-8 alkyl group and more preferably a C1-4 alkyl group.

Examples of compounds represented by formula (IV) include methyl(meth)acrylate ester, ethyl(meth)acrylate ester, propyl(meth)acrylate ester, butyl(meth)acrylate ester, pentyl(meth)acrylate ester, hexyl(meth)acrylate ester, heptyl (meth)acrylate ester, octyl(meth)acrylate ester, 2-ethylhexyl (meth)acrylate ester, nonyl(meth)acrylate ester, decyl(meth) acrylate ester, undecyl(meth)acrylate ester and dodecyl (meth)acrylate ester. These may be used alone or in combinations of two or more.

The (A) binder polymer is preferably one containing a carboxyl group from the viewpoint of the alkali developing property. The binder polymer with a carboxyl group may be produced by radical polymerization of, for example, a carboxyl group-containing polymerizable monomer and another polymerizable monomer. (Meth)acrylic acid is preferred as the carboxyl group-containing polymerizable monomer, with methacrylic acid being especially preferred.

The carboxyl group content of the (A) binder polymer (the proportion of polymerizable monomers with carboxyl groups with respect to the total polymerizable monomers used) is preferably 12-50 wt %, more preferably 12-40 wt %, even more preferably 15-30 wt % and most preferably 15-25 wt %, from the viewpoint of achieving a satisfactory balance between alkali developing property and alkali resistance. A carboxyl group content of less than 12 wt % will tend to result in an inferior alkali developing property, while a content of greater than 50 wt % will tend to lower the alkali resistance and reduce the adhesiveness.

From the viewpoint of resolution and adhesiveness, the (A) binder polymer preferably also contains styrene or a styrene derivative as a polymerizable monomer.

When styrene or a styrene derivative is used as the copolymerizing component, the content (the proportion of the styrene or styrene derivative with respect to the total polymerizable monomer used) is preferably 0.1-40 wt %, more preferably 1-35 wt % and even more preferably 5-30 wt %, from the viewpoint of achieving satisfactory adhesiveness and release property. If the content is less than 0.1 wt % the adhesiveness of the formed resist pattern will tend to be inferior, and if it is greater than 40 wt % the release strips will be larger, tending to lengthen the release time.

Such binder polymers are used alone or in combinations of two or more. Examples of binder polymers, when two or more are used in combination, include two or more binder polymers composed of different copolymerizing components, two or more binder polymers with different weight-average molecular weights, and two or more binder polymers with different dispersibilities.

From the viewpoint of a balance between the mechanical strength and alkali developing property, the weight-average molecular weight of the (A) binder polymer is preferably 20,000-300,000, more preferably 40,000-150,000 and most preferably 50,000-120,000. A weight-average molecular weight of less than 20,000 will tend to result in lower developing solution resistance, and greater than 300,000 will tend to lengthen the developing time. The weight-average molecular weight for the purpose of the invention is the value measured by gel permeation chromatography and calculated using a calibration curve prepared using standard polystyrene.

Examples for the (B) photopolymerizing compound having ethylenic unsaturated bonds in the molecule include compounds obtained by reacting polyhydric alcohols with α,β-unsaturated carboxylic acids, bisphenol A-based (meth)acrylate compounds, compounds obtained by reacting glycidyl group-containing compounds with α,β-unsaturated carboxylic acids, urethane monomers such as urethane bond-containing (meth)acrylate compounds, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, alkyl(meth)acrylate esters and the like. These may be used alone or in combinations of two or more.

Examples of compounds obtained by reacting polyhydric alcohols with α,β-unsaturated carboxylic acids include polyethyleneglycol di(meth)acrylates with an average of 2-14 ethylene groups, polypropyleneglycol di(meth)acrylates with an average of 2-14 propylene groups, polyethylenepolypropyleneglycol di(meth)acrylates with an average of 2-14 ethylene groups and an average of 2-14 propylene groups, trimethylolpropane di(meth)acrylate, trimethylolpropane tri (meth)acrylate, trimethylolpropaneethoxy tri(meth)acrylate, trimethylolpropanediethoxy tri(meth)acrylate, trimethylolpropanetriethoxy tri(meth)acrylate, trimethylolpropanetetraethoxy tri(meth)acrylate, trimethylolpropanepentaethoxy tri (meth)acrylate, tetramethylolmethane tri(meth)acrylate, tetramethylolmethane tetra(meth)acrylate, polypropyleneglycol di(meth)acrylates with an average of 2-14 propylene groups, dipentaerythritol penta(meth)acrylate, dipentaerythritol hexa(meth)acrylate and the like. These may be used alone or in combinations of two or more.

Examples of urethane monomers include addition reaction products of (meth)acrylic monomers with a hydroxyl group at the β position and diisocyanate compounds such as isophorone diisocyanate, 2,6-toluene diisocyanate, 2,4-toluene diisocyanate and 1,6-hexamethylene diisocyanate, as well as tris ((meth)acryloxytetraethyleneglycol isocyanate) hexamethylene isocyanurate, EO-modified urethane di(meth)acrylate and EO,PO-modified urethane di(meth) acrylate. "EO" stands for ethylene oxide, and an EO-modified compound has a block structure of ethylene oxide groups. "PO" stands for propylene oxide, and a PO-modified compound has a block structure of propylene oxide groups. An example of an EO-modified urethane di(meth)acrylate is UA-11, product name of Shin-Nakamura Chemical Co., Ltd. An example of an EO,PO-modified urethane di(meth)acrylate compound is UA-13, product name of Shin-Nakamura Chemical Co., Ltd. These may be used alone or in combinations of two or more.

From the viewpoint of improving the balance between photosensitivity, resolution, adhesiveness and release property, the (B) photopolymerizing compound having ethylenic unsaturated bonds in the molecule preferably includes a photopolymerizing compound having one polymerizable ethylenic unsaturated bond in the molecule and a photopolymerizing compound having two or more polymerizable ethylenic unsaturated bonds in the molecule.

When component (B) includes a photopolymerizing compound having one polymerizable ethylenic unsaturated bond in the molecule, the content is preferably 1-50 wt %, more preferably 5-45 wt % and even more preferably 10-40 wt % based on the total solid weight of component (B), from the viewpoint of improving the balance between photosensitivity, resolution, adhesiveness and release property.

When component (B) includes a photopolymerizing compound having two or more polymerizable ethylenic unsaturated bonds in the molecule, the content is preferably 10-90 wt %, more preferably 20-85 wt % and even more preferably 30-80 wt %, based on the total solid weight of component (B), from the viewpoint of improving the balance between photosensitivity, resolution, adhesiveness and release property.

The (B) photopolymerizing compound having ethylenic unsaturated bonds in the molecule preferably includes a bisphenol A-based (meth)acrylate compound represented by the following formula (II), from the viewpoint of obtaining satisfactory photosensitivity and resolution for the photosensitive resin composition.

[Chemical Formula 4]

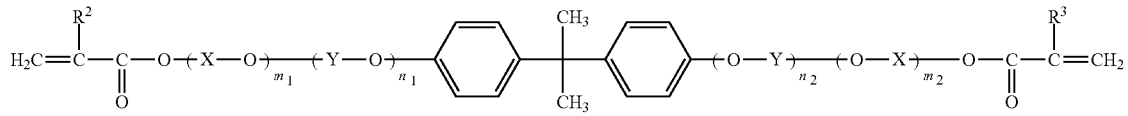

(II)

In formula (II), $R^2$ and $R^3$ each independently represent hydrogen atom or a methyl group. X and Y each independently a C1-6 alkylene group, preferably a C1-4 alkylene group and more preferably a C2-3 alkylene group. The symbols $m_1$, $m_2$, $n_1$ and $n_2$ represent integers of 0-20, selected so that $m_1+m_2+n_1+n_2=0$-40. Preferably, $m_1+m_2+n_1+n_2$ is an integer of 2-20, and more preferably 4-12.

Examples of compounds represented by formula (II) include 2,2-bis(4-((meth)acryloxypolyethoxy)phenyl)propanes, 2,2-bis(4-((meth)acryloxypolypropoxy)phenyl)propanes and 2,2-bis(4-((meth)acryloxypolyethoxypolypropoxy)phenyl)propanes.

Specific examples of 2,2-bis(4-((meth)acryloxypolyethoxy)phenyl)propanes include 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)

acryloxydecaethoxy)phenyl)propane, 2,2-bis(4-((meth) acryloxyundecaethoxy)phenyl)propane, 2,2-bis(4-((meth) acryloxydodecaethoxy)phenyl)propane, 2,2-bis(4-((meth) acryloxytridecaethoxy)phenyl)propane, 2,2-bis(4-((meth) acryloxytetradecaethoxy)phenyl)propane, 2,2-bis(4-((meth) acryloxypentadecaethoxy)phenyl)propane and 2,2-bis(4-((meth)acryloxyhexadecaethoxy)phenyl)propane. Among these, 2,2-bis(4-(methacryloxypentaethoxy)phenyl)propane is commercially available as BPE-500 (product name of Shin-Nakamura Chemical Co., Ltd.) or FA-321 M (product name of Hitachi Chemical Co., Ltd.), and 2,2-bis(4-(methacryloxypentadecaethoxy)phenyl)propane is commercially available as BPE-1300 (product name of Shin-Nakamura Chemical Co., Ltd.). These may be used alone or in combinations of two or more.

Specific examples of 2,2-bis(4-((meth)acryloxypolypropoxy)phenyl)propanes include 2,2-bis(4-((meth)acryloxydipropoxy)phenyl)propane, 2,2-bis(4-((meth)acryloxytripropoxy)phenyl)propane, 2,2-bis(4-((meth)acryloxytetrapropoxy)phenyl)propane, 2,2-bis(4-((meth)acryloxypentapropoxy)phenyl)propane, 2,2-bis(4-((meth)acryloxyhexapropoxy)phenyl)propane, 2,2-bis(4-((meth)acryloxyheptapropoxy)phenyl)propane, 2,2-bis(4-((meth)acryloxyoctapropoxy)phenyl)propane, 2,2-bis(4-((meth)acryloxynonapropoxy)phenyl)propane, 2,2-bis(4-((meth)acryloxydecapropoxy)phenyl)propane, 2,2-bis(4-((meth)acryloxyundecapropoxy)phenyl)propane, 2,2-bis(4-((meth)acryloxydodecapropoxy)phenyl)propane, 2,2-bis(4-((meth)acryloxytridecapropoxy)phenyl)propane, 2,2-bis(4-((meth)acryloxytetradecapropoxy)phenyl)propane, 2,2-bis(4-((meth)acryloxypentadecapropoxy)phenyl)propane and 2,2-bis(4-((meth)acryloxyhexadecapropoxy)phenyl)propane. These may be used alone or in combinations of two or more.

Specific examples of 2,2-bis(4-((meth)acryloxypolyethoxypolypropoxy)phenyl)propanes include 2,2-bis(4-((meth)acryloxydiethoxyoctapropoxy)phenyl)propane, 2,2-bis(4-((meth)acryloxytetraethoxytetrapropoxy)phenyl)propane, 2,2-bis(4-((meth)acryloxyhexaethoxyhexapropoxy)phenyl)propane and the like. These may be used alone or in combinations of two or more.

The (B) photopolymerizing compound having ethylenic unsaturated bonds in the molecule preferably includes 2,2-bis(4-((meth)acryloxypolyethoxy)phenyl)propane among the compounds represented by formula (II) above, from the viewpoint of more satisfactory photosensitivity and resolution, and more preferably it includes a compound wherein $R^2$ and $R^3$ in formula (II) are methyl groups, X and Y are ethylene groups, $n^1$ and $n^2$ are 0, and $m^1+m^2=10$ (average value) (for example, "FA-321M", product name of Hitachi Chemical Co., Ltd.).

When the (B) photopolymerizing compound having ethylenic unsaturated bonds in the molecule includes a compound represented by formula (II) above, the content is preferably 10-90 wt %, more preferably 20-85 wt % and even more preferably 30-80 wt %, based on the total amount of component (B), from the viewpoint of the balance between photosensitivity and resolution.

The (B) photopolymerizing compound having ethylenic unsaturated bonds in the molecule preferably comprises a compound represented by the following formula (III), from the viewpoint of obtaining satisfactory photosensitivity.

[Chemical Formula 5]

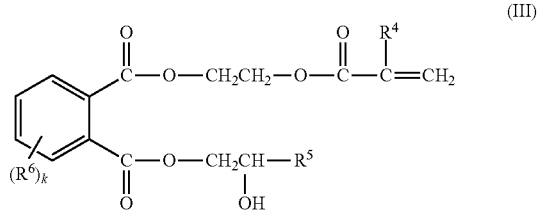

(III)

In formula (III), $R^4$ represents hydrogen atom or a methyl group. $R^5$ represents hydrogen atom or a methyl or halogenated methyl group, preferably a methyl or halogenated methyl group, and more preferably a halogenated methyl group. $R^6$ represents C1-6 alkyl, a halogen atom or a hydroxyl group, and k represents an integer of 0-4. When k is 2 or greater, the multiple $R^6$ groups may be the same or different.

Examples of compounds represented by formula (III) above include γ-chloro-β-hydroxypropyl-β'-(meth)acryloyloxyethyl-o-phthalate, β-hydroxyethyl-β'-(meth)acryloyloxyethyl-o-phthalate and β-hydroxypropyl-β'-(meth)acryloyloxyethyl-o-phthalate, among which γ-chloro-β-hydroxypropyl-β'-(meth)acryloyloxyethyl-o-phthalate is preferred. Of these, γ-chloro-β-hydroxypropyl-β'-methacryloyloxyethyl-o-phthalate is commercially available as FA-MECH (product name of Hitachi Chemical Co., Ltd.). These may be used alone or in combinations of two or more.

When the (B) photopolymerizing compound having ethylenic unsaturated bonds in the molecule includes a compound represented by formula (III) above, the content is preferably 1-50 wt %, more preferably 5-45 wt % and even more preferably 10-40 wt %, based on the total amount of component (B), from the viewpoint of the balance between photosensitivity, release property and coated film properties.

The (C) photopolymerization initiator comprises an acridine compound. There are no particular restrictions on the acridine compound so long as it is a compound with at least one acridinyl group in the molecule, and examples thereof include 9-phenylacridine, 9-(p-methylphenyl)acridine, 9-(m-methylphenyl)acridine, 9-(p-chlorophenyl)acridine, 9-(m-chlorophenyl)acridine, 9-pyridylacridine, 9-pyrazinylacridine, 9-aminoacridine, 9-alkylaminoacridine, and acridine compounds represented by the following formula (I). These may be used alone or in combinations of two or more.

From the viewpoint of obtaining more satisfactory adhesiveness, resolution and resist shapes, the acridine compound preferably contains an acridine compound with two acridinyl groups in the molecule, and more preferably contains a compound represented by the following formula (I).

[Chemical Formula 6]

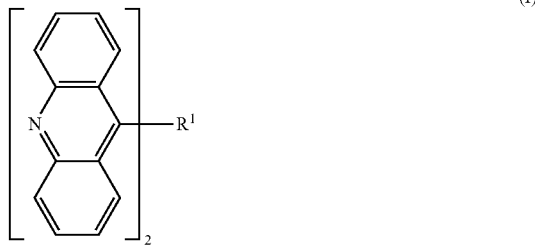

(I)

In formula (I), $R^1$ represents a C2-20 alkylene oxadialkylene or thiodialkylene group. $R^1$ is preferably a C2-20 alkylene group, more preferably a C4-15 alkylene group and even more preferably a C6-12 alkylene group.

Examples of compounds represented by formula (I) include bis(9-acridinyl)alkanes such as 1,2-bis(9-acridinyl)ethane, 1,3-bis(9-acridinyl)propane, 1,4-bis(9-acridinyl)butane, 1,5-bis(9-acridinyl)pentane, 1,6-bis(9-acridinyl)hexane, 1,7-bis(9-acridinyl)heptane, 1,8-bis(9-acridinyl)octane, 1,9-bis(9-acridinyl)nonane, 1,10-bis(9-acridinyl)decane, 1,11-bis(9-acridinyl)undecane, 1,12-bis(9-acridinyl)dodecane, 1,14-bis(9-acridinyl)tetradecane, 1,16-bis(9-acridinyl)hexadecane, 1,18-bis(9-acridinyl)octadecane and 1,20-bis(9-acridinyl)eicosane, and 1,3-bis(9-acridinyl)-2-oxapropane, 1,3-bis(9-acridinyl)-2-thiapropane, 1,5-bis(9-acridinyl)-3-thiapentane, and the like. They may be used alone or in combinations of two or more.

From the viewpoint of resolution, adhesiveness and resist shapes, the acridine compound content is preferably 0.01-10 parts by weight, more preferably 0.1-5 parts by weight and even more preferably 0.5-3 parts by weight, with 100 parts by weight as the total of component (A) and component (B).

The (C) photopolymerization initiator may contain a photopolymerization initiator other than the acridine compound. Examples of photopolymerization initiators other than the acridine compound include aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1 and 2-methyl-1-[4-(methylthio)phenyl]-2-morpholino-propanone-1, quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone, benzoinether compounds such as benzoinmethyl ether, benzoinethyl ether and benzoinphenyl ether, benzoin compounds such as benzoin, methylbenzoin and ethylbenzoin, benzyl derivatives such as benzyldimethylketal, substituted anthracenes such as 9,10-dimethoxyanthracene, 9,10-diethoxyanthracene, 9,10-dipropoxyanthracene, 9,10-dibutoxyanthracene and 9,10-dipentoxyanthracene, 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer, and N-phenylglycine, N-phenylglycine derivatives, coumarin-based compounds, oxazole-based compounds, pyrazoline-based compounds, and the like. The aryl substituents of any two 2,4,5-triarylimidazoles may be identical for a symmetrical compound, or they may be different for an asymmetrical compound. A combination of a thioxanthone-based compound and tertiary amine compound may also be used, such as a combination of diethylthioxanthone and dimethylaminobenzoic acid. They may be used alone or in combinations of two or more.

From the viewpoint of more satisfactory photosensitivity, the (C) photopolymerization initiator preferably contains an aromatic ketone, more preferably it contains a benzophenone, and even more preferably it contains N,N'-tetramethyl-4,4'-diaminobenzophenone (Michler's ketone).

The (D) polymerization inhibitor is not particularly restricted so long as it has a polymerization inhibiting effect for radical polymerization, and examples thereof include catechols such as t-butylcatechol, hydroquinones such as hydroquinone, methylhydroquinone, t-butylhydroquinone and p-methoxyphenol, alkoxyquinones such as methoxyquinone, and benzoquinones such as p-benzoquinone, methyl-p-benzoquinone and t-butyl-p-benzoquinone. From the viewpoint of more effectively improving the photosensitivity, a hydroquinone is preferred and p-methoxyphenol is more preferred.

The content of the (A) binder polymer is preferably 30-80 parts by weight, more preferably 40-75 parts by weight and even more preferably 50-70 parts by weight with respect to 100 parts by weight as the total of component (A) and component (B). If the content of component (A) is within this range, the coatability and photocured strength of the photosensitive resin composition will be more satisfactory.

The content of the (B) photopolymerizing compound having ethylenic unsaturated bonds in the molecule is preferably 20-60 parts by weight, more preferably 30-55 parts by weight and even more preferably 35-50 parts by weight with respect to 100 parts by weight as the total of component (A) and component (B). If the content of component (B) is within this range, the photosensitivity and coatability of the photosensitive resin composition will be more satisfactory.

The content of the (C) photopolymerization initiator is preferably 0.01-20 parts by weight, more preferably 0.1-10 parts by weight and even more preferably 0.2-5 parts by weight, with respect to 100 parts by weight as the total of component (A) and component (B). If the content of component (C) is within this range, the photosensitivity and internal photocuring property of the photosensitive resin composition will be more satisfactory.

The content of the (D) polymerization inhibitor is 20-100 ppm by weight based on the total solid content including the polymerization inhibitor present in the entire photosensitive resin composition, and from the viewpoint of further improving the photosensitivity, it is preferably 20-80 ppm by weight and more preferably 20-65 ppm by weight. If the content is less than 20 ppm by weight, the stability of the photosensitive resin composition will tend to be insufficient, and if it exceeds 100 ppm by weight the photosensitivity will tend to be lowered.

The method of adjusting the content of the (D) polymerization inhibitor in the photosensitive resin composition of the invention is not particularly restricted, but a first method is a method of adjusting the amount of the (D) polymerization inhibitor added alone during preparation of the photosensitive resin composition, a second method is a method of using the (A) binder polymer which has a pre-adjusted amount of addition of the (D) polymerization inhibitor, and a third method is a method of using the (B) photopolymerizing compound having ethylenic unsaturated bonds in the molecule, which has a pre-adjusted amount of addition of the (D) polymerization inhibitor. While it is preferred to use the third method from the viewpoint of obtaining sufficient photosensitivity, two or more of the first to third methods may be combined, depending on the desired content of the (D) polymerization inhibitor.

The photosensitive resin composition of the invention may also contain additives including, if necessary, a dye such as Malachite Green, Victoria Pure Blue, Brilliant Green or Methyl Violet, a coloring agent such as tribromophenylsulfone, leuco crystal violet, diphenylamine, benzylamine, triphenylamine, diethylaniline or o-chloroaniline, a thermal development inhibitor, a plasticizer such as p-toluenesulfonamide, or a pigment, filler, antifoaming agent, flame retardant, tackifier, leveling agent, release promoter, antioxidant, aromatic, imaging agent, thermal crosslinking agent or the like. The contents of such additives when used may be about 0.01-20 parts by weight each with respect to 100 parts by weight as the total of component (A) and component (B). These additives may be used alone or in combinations of two or more.

The photosensitive resin composition of the invention may, if necessary, be dissolved in a solvent such as methanol, ethanol, acetone, methyl ethyl ketone, methylcellosolve, ethylcellosolve, toluene, N,N-dimethylformamide or propyleneglycol monomethyl ether, or a mixture of such solvents, for coating as a solution with a solid content of about 30-60 wt %. They may be used alone or in combinations of two or more.

Without any particular restrictions, the photosensitive resin composition of the invention is preferably coated as a liquid resist onto the surface of a metal such as copper, a copper-based alloy, nickel, chromium, iron or an iron-based alloy such as stainless steel, and preferably copper or a copper-based alloy or iron-based alloy, and then dried and subsequently covered with a protective film if necessary, or else used in the form of a photosensitive element.

A photosensitive element according to the invention will now be explained. The photosensitive element of the invention is provided with a support and a photosensitive resin composition layer formed on the support, with a protective film further provided on and covering the photosensitive resin composition layer.

FIG. 1 is a schematic cross-sectional view showing a preferred embodiment of a photosensitive element of the invention. The photosensitive element 1 shown in FIG. 1 has a structure with a photosensitive resin composition layer 14 laminated on a support 10. The photosensitive resin composition layer 14 is a layer composed of a photosensitive resin composition of the invention as described above. The side F1 of the photosensitive resin composition layer 14 opposite the support side in the photosensitive element 1 may also be covered with a protective film (not shown), if necessary.

The support 10 is, for example, a polymer film having heat resistance and solvent resistance, such as polyethylene terephthalate, polypropylene, polyethylene or polyester. From the viewpoint of transparency, it is preferred to use a polyethylene terephthalate film. Also, since such polymer films must be subsequently removable from the photosensitive resin composition layer, they must not be made of a material or be surface treated in a manner that would prevent their removal. The thickness of such a polymer film is preferably 1-100 µm, more preferably 1-50 µm and most preferably 1-30 µm. If the thickness is less than 1 µm, problems such as reduced mechanical strength and tearing of the polymer film during coating will tend to occur, and if it exceeds 100 µm, the resolution will tend to be lower and the production cost increased.

One of the polymer films may be used as the support for the photosensitive resin composition layer, while another is used as a protective film for the photosensitive resin composition, thus being laminated on both sides of the photosensitive resin composition layer.

The protective film is preferably one such that the adhesive force between the photosensitive resin composition layer and the protective film is lower than the adhesive force between the photosensitive resin composition layer and the support, and it is also preferably a low-fisheye film.

The photosensitive resin composition is coated onto the support 10 and dried to form the photosensitive resin composition layer 14.

The coating may be accomplished by a publicly known method using a roll coater, comma coater, gravure coater, air knife coater, die coater, bar coater, spray coater or the like. The drying may be carried out at 70-150° C. for about 5-30 minutes. The amount of residual organic solvent in the photosensitive resin composition layer is preferably no greater than 2 wt % from the viewpoint of preventing diffusion of the organic solvent in subsequent steps.

The thickness of the photosensitive resin composition layer will differ depending on the use, but the post-drying thickness is preferably 1-200 µm, more preferably 5-100 µm and most preferably 10-50 µm. A thickness of less than 1 µm will tend to hamper industrial coating, while a thickness of greater than 200 µm will lower the effect of the invention and tend to result in lower sensitivity, thus impairing the photocuring property at the base of the resist.

The photosensitive element may also comprise an interlayer such as a cushion layer, adhesive layer, photoabsorbing layer or gas barrier layer as necessary. The photosensitive element obtained in this manner is stored, for example, in a sheet form or in a wound form around a roll as the winding core. An edge separator is preferably situated at the edge of the photosensitive element roll from the viewpoint of edge protection, while from the viewpoint of preventing edge fusion, the edge separator is preferably moisture-proof The winding core may be, for example, a plastic such as polyethylene resin, polypropylene resin, polystyrene resin, polyvinyl chloride resin or ABS (acrylonitrile-butadiene-styrene copolymer).

The method for forming a resist pattern according to this embodiment will now be explained. The method for forming a resist pattern according to this embodiment is a method comprising a lamination step in which the photosensitive resin composition layer, composed of a photosensitive resin composition according to this embodiment, or the photosensitive resin composition layer of a photosensitive element, is laminated on a board, an exposure step in which prescribed sections of the photosensitive resin composition layer are irradiated with active light rays for photocuring of the exposed sections, and a developing step in which the sections other than the exposed sections of the photosensitive resin composition layer are removed to form a resist pattern.

One method of forming a resist pattern of this embodiment involves laminating a photosensitive resin composition layer composed of the photosensitive resin composition described above on a board (circuit-forming board), and irradiating it with active light rays in an image pattern for photocuring of the exposed sections, and removing the unexposed sections (photocured sections) by development.

The board used here is not particularly restricted, but for most cases a circuit-forming board comprising an insulating layer and a conductive layer formed on the insulating layer is used.

Lamination of the photosensitive resin composition layer on the board may be accomplished by coating the photosensitive resin composition on the board by a method such as screen printing, spraying, roll coating, curtain coating or electrostatic coating, and drying the coating film at 60-110° C.

Another method of forming a resist pattern of this embodiment involves laminating the photosensitive element 1 onto a board so as to bond the photosensitive resin composition layer 14, and irradiating it with active light rays in an image pattern for photocuring of the exposed sections, and removing the unexposed sections (photocured sections) by development.

When the aforementioned protective film is used during formation of a resist pattern using a photosensitive element, the method may involve removing the protective film and then contact bonding the photosensitive resin composition layer to the circuit-forming board while heating it for lamination, with the lamination preferably being carried out under reduced pressure from the viewpoint of adhesiveness and follow-up property. The surface to be laminated is not particularly restricted, but is usually a metal surface. The heating temperature for the photosensitive resin composition layer is preferably 70-130° C., and the contact bonding pressure is preferably about 0.1-1.0 MPa (about 1-10 kgf/cm$^2$), although there is no particular restriction to these conditions. If the photosensitive resin composition layer is heated at 70-130° C. as mentioned above it is not necessary to subject the circuit-forming board to preheating beforehand, but the circuit-forming board may nevertheless be preheated for further enhanced laminating properties.

The laminated photosensitive resin composition layer is irradiated with active light rays in an image form, through a negative or positive mask pattern known as artwork. When the polymer film on the photosensitive resin composition layer is transparent, direct irradiation with active light rays is possible, but it may need to be removed if it is opaque. The light source for the active light rays may be a conventionally known light source such as, for example, a carbon arc lamp, mercury vapor arc lamp, ultra-high-pressure mercury lamp, high-pressure mercury lamp, xenon lamp or the like, which efficiently emits ultraviolet rays. There may also be used a lamp that efficiently emits visible light rays, such as a photoflood lamp or sun lamp.

In the exposure step for the photosensitive resin composition layer, it is preferred to employ a method of forming an image with active light rays by a laser direct writing method, such as DLP (Digital Light Processing) exposure. The light source used for the active light rays may be a known light source such as a YAG laser, semiconductor laser or gallium nitride-based violet laser.

When the support remains on the photosensitive resin composition layer after exposure, the support is removed and the unexposed sections are then removed by development such as wet development or dry development, to form a resist pattern. In the case of wet development, a developing solution suitable for photosensitive resin compositions may be used, such as an aqueous alkali solution, aqueous developing solution or organic solvent, and development may be accomplished by a publicly known method such as spraying, reciprocal dipping, brushing, scrapping or the like. The developing solution used is one which is safe and stable and easily manageable, such as an aqueous alkali solution.

Examples of bases to be used for the aqueous alkali solution include alkali metal hydroxides such as lithium, sodium or potassium hydroxides, alkali metal carbonates such as lithium, sodium or potassium carbonates or bicarbonates, ammonium carbonate or bicarbonate, alkali metal phosphates such as potassium phosphate and sodium phosphate, and alkali metal pyrophosphates such as sodium pyrophosphate and potassium pyrophosphate.

The aqueous alkali solution used for development is preferably a 0.1-5 wt % sodium carbonate dilute solution, a 0.1-5 wt % potassium carbonate dilute solution, a 0.1-5 wt % sodium hydroxide dilute solution or a 0.1-5 wt % sodium tetraborate dilute solution. The pH of the aqueous alkali solution used for development is preferably in the range of 9-11, and the temperature is adjusted as appropriate for the developing property of the photosensitive resin composition layer. The aqueous alkali solution may also contain added surfactants, antifoaming agents, and small amounts of organic solvent to accelerate development.

An aqueous developing solution used is composed of water or an aqueous alkali solution and one or more different organic solvents. Examples of bases for aqueous alkali solutions other than those mentioned above include borax, or sodium metasilicate, tetramethylammonium hydroxide, ethanolamine, ethylenediamine, diethylenetriamine, 2-amino-2-hydroxymethyl-1,3-propanediol, 1,3-diaminopropanol-2, morpholine and the like. The pH of the developing solution is preferably in a range allowing sufficient development of the resist, and is preferably pH 8-12 and more preferably pH 9-10.

As examples of organic solvents there may be mentioned triacetone alcohol, acetone, ethyl acetate, alkoxyethanols with C1-4 alkoxy groups, ethyl alcohol, isopropyl alcohol, butyl alcohol, diethyleneglycol monomethyl ether, diethyleneglycol monoethyl ether, diethyleneglycol monobutyl ether and the like. These may be used alone or in combinations of two or more. The concentration of the organic solvent is normally preferred to be 2-90 wt %, and the temperature may be adjusted as appropriate for the developing property. The aqueous developing solution may also contain small amounts of added surfactants, antifoaming agents and the like. Examples of organic solvent-based developing solutions to be used alone include 1,1,1-trichloroethane, N-methylpyrrolidone, N,N-dimethylformamide, cyclohexanone, methyl isobutyl ketone and γ-butyrolactone. Water is preferably added to these organic solvents in a range of 1-20 wt % for anti-flammability.

For the method of forming a resist pattern according to the invention, two or more of the aforementioned developing methods may be carried out together as necessary. The developing system may be a dip system, paddle system, spray system, brushing, slapping or the like, but a high-pressure spray system is most suitable for improved resolution. Treatment following the developing step may consist of heating at about 60-250° C. or exposure at an exposure dose of about 0.2-10 mJ/cm$^2$, if necessary for further curing of the resist pattern.

For production of a printed circuit board using a photosensitive element of the invention, the surface of the circuit-forming board is treated by a known process such as etching or plating using the developed resist pattern as a mask.

Etching of the metal surface may be accomplished using a cupric chloride solution, ferric chloride solution, alkali etching solution, hydrogen peroxide-based etching solution or the like, although a ferric chloride solution is preferred for a more satisfactory etch factor. The plating process may be, for example, copper plating such as copper sulfate plating or copper pyrophosphate plating, solder plating such as high throwing solder plating, nickel plating such as Watt bath (nickel sulfate-nickel chloride) plating or nickel sulfaminate plating, or gold plating such as hard gold plating or soft gold plating. These known methods may be employed as appropriate.

The resist pattern is then released, for example, with an aqueous solution of stronger alkalinity than the aqueous alkali solution used for development. The strongly alkaline aqueous solution used here may be, for example, a 1-10 wt % sodium hydroxide aqueous solution or a 1-10 wt % potassium hydroxide aqueous solution. The releasing system may be, for example, a dipping system, spraying system or the like, which may be used either alone or in combinations.

The method for manufacturing a printed circuit board according to the invention as described above may be applied to manufacture of not only single-layer printed circuit boards but also multilayer printed circuit boards, while it may also be applied to manufacture of printed circuit boards with miniature through-holes. By using the photosensitive resin composition and photosensitive element of the invention to form a resist pattern by the series of steps described above, and etching or plating the circuit-formed board over which the resist pattern has been formed, it is possible to produce a printed circuit board with very high production efficiency, especially for laser direct writing.

The embodiments described above are only preferred embodiments of the invention, and the invention is in no way limited thereto.

EXAMPLES

The present invention will now be explained in greater detail by the following examples.

Examples 1-3 and Comparative Examples 1-3

First, binder polymers having the compositions listed in Table 1 were synthesized according to Synthesis Example 1.

Synthesis Example 1

In a flask equipped with a stirrer, reflux condenser, thermometer, dropping funnel and nitrogen gas inlet tube there was added 400 g of a mixture of methylcellosolve and toluene in a weight ratio of 6:4, and the obtained mixture was stirred while blowing in nitrogen gas and heated to 80° C. As copolymerizing monomer there was prepared a mixed solution of 100 g of methacrylic acid, 250 g of methyl methacrylate, 100 g of ethyl acrylate, 50 g of styrene and 0.8 g of azobisisobutyronitrile (hereinafter referred to as "solution a"), and, over a period of 4 hours, solution "a" was added dropwise to the mixture of methylcellosolve and toluene in a weight ratio of 6/4 that had been heated to 80° C., after which the obtained mixture was kept for 2 hours at 80° C. while stirring. Also, a solution of 1.2 g of azobisisobutyronitrile dissolved in 100 g of a mixture of methylcellosolve and toluene in a weight ratio of 6/4 was further added dropwise to the flask over a period of 10 minutes. After keeping the dropped solution at 80° C. for 3 hours while stirring, it was heated to 90° C. over a period of 30 minutes. It was then kept at 90° C. for 2 hours and subsequently cooled to obtain a binder polymer solution as component (A). Acetone was added to the binder polymer solution, and the mixture was adjusted to a non-volatilizing component content (solid portion) of 50 wt %. The weight-average molecular weight of the binder polymer was 80,000. The weight-average molecular weight was measured by gel permeation chromatography, and calculation was performed using a standard polystyrene calibration curve. The GPC conditions were as follows.

(GPC Conditions)
Pump: Hitachi L-6000 (Hitachi, Ltd.)
Column: Gelpack GL-R420+Gelpack GL-R430+Gelpack GL-R440 (total: 3) [all product names of Hitachi Chemical Co., Ltd.]
Eluent: tetrahydrofuran
Measuring temperature: 25° C.
Flow rate: 2.05 mL/min
Detector: Hitachi L-3300 RI (product name of Hitachi, Ltd.).

Next, component (A) obtained by Synthesis Example 1, additives and solvents listed in Table 1 were combined with component (B) and component (C) listed in Table 2, to obtain a photosensitive resin composition solution.

TABLE 1

| | Materials | Content (g) |
|---|---|---|
| Component (A) | 50 wt % Methyl cellosolve/toluene = 6/4 (weight ratio) solution of methacrylic acid/methyl methacrylate/ethyl acrylate/styrene (20/50/20/10 (weight ratio)), weight-average molecular weight 80,000 | Solid portion: 55 |
| Additives | Malachite Green | 0.05 |
| | Leuco Crystal Violet | 0.5 |
| Solvents | Acetone | 5 |
| | Toluene | 5 |
| | Methanol | 5 |

TABLE 2

| | | Examples | | | Comparative Examples | | |
|---|---|---|---|---|---|---|---|
| | | 1 | 2 | 3 | 1 | 2 | 3 |
| Component (B) | FA-321M(70) *1 | 30 | 25 | 30 | — | — | 30 |
| | FA-321M(220) *2 | — | — | — | 30 | 30 | — |
| | FA-MECH(100) *3 | 15 | 10 | — | — | — | 15 |
| | FA-MECH(500) *4 | — | — | — | 15 | 15 | — |
| | FA-023M *5 | — | 10 | — | — | — | — |
| | A-GLY-9E *6 | — | — | 15 | — | — | — |
| Component (C) | 1,7-bis(9,9'-Acridinyl)heptane | 1 | 1 | 1 | 1 | — | — |
| | N,N'-Tetraethyl-4,4'-diaminobenzophenone | 0.02 | 0.02 | 0.02 | 0.02 | — | — |
| | 2-(o-Chlorophenyl)-4,5-diphenylimidazole dimer | — | — | — | — | 4 | 4 |

TABLE 2-continued

|  | Examples | | | Comparative Examples | | |
|---|---|---|---|---|---|---|
|  | 1 | 2 | 3 | 1 | 2 | 3 |
| 9,10-Dibutoxyanthrancene | — | — | — | — | 1 | 1 |
| Total polymerization inhibitor content (ppm by weight) | 35 | 49 | 65 | 139 | 134 | 34 |

*The contents of component (B) and component (C) are based on solid portion (g)
*1: 2,2-bis(4-(Methacryloxypentaethoxy)phenyl)propane containing 70 ppm by weight p-methoxyphenol [product name of Hitachi Chemical Co., Ltd.]
*2: 2,2-bis(4-(Methacryloxypentaethoxy)phenyl)propane containing 220 ppm by weight p-methoxyphenol [product name of Hitachi Chemical Co., Ltd.]
*3: γ-Chloro-β-hydroxypropyl-β'-methacryloyloxyethyl-o-phthalate, containing 100 ppm by weight p-methoxyphenol [product name of Hitachi Chemical Co., Ltd.]
*4: γ-Chloro-β-hydroxypropyl-β'-methacryloyloxyethyl-o-phthalate, containing 500 ppm by weight p-methoxyphenol [product name of Hitachi Chemical Co., Ltd.]
*5: Compound represented by the following formula (V), containing 220 ppm by weight p-methoxyphenol based on the total solid weight [product name of Hitachi Chemical Co., Ltd.]
[Chemical Formula 7]

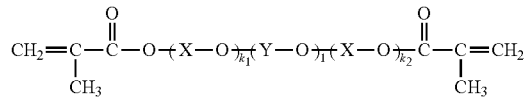

(V)

[In formula (V), X represents an ethylene group, Y represents a propylene group, $k_1 + k_2 = 6$ (average value) and $l = 12$ (average value).]
*6: Compound represented by the following formula (VI), containing 300 ppm by weight p-methoxyphenol based on the total solid weight [product name of Shin-Nakamura Chemical Co., Ltd.]
[Chemical Formula 8]

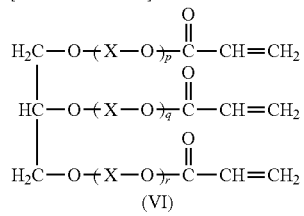

(VI)

[In formula (VI), X represents an ethylene group and $p + q + r = 9$ (average value).]

The solution of the obtained photosensitive resin composition was then evenly coated onto a 16 μm thick polyethylene terephthalate film (product name: "G2-16" by Teijin, Ltd.), and dried for 10 minutes with a hot air convection drier at 100° C., to form a photosensitive resin composition layer. The photosensitive resin composition layer was protected with a polyethylene protective film (product name: "NF-13" by Tamapoly Co., Ltd.) to obtain a photosensitive resin composition laminated body. The film thickness of the photosensitive resin composition layer was 40 μm.

Next, the copper surface of a copper-clad laminate (product name: "MCL-E-61" by Hitachi Chemical Co., Ltd.) comprising a glass epoxy material laminated on both sides of a copper foil (35 μm thickness) was polished using a polishing machine with a #600-equivalent brush (Sankei Co., Ltd.), and after rinsing with water, it was dried with an air stream. The obtained copper-clad laminate was heated to 80° C., and the photosensitive resin composition layer was laminated on its copper surface using a heat roll at 110° C. at a speed of 1.5 m/min, while releasing the protective film, to obtain a test board.

<Evaluation of Photosensitivity>

A Hitachi 41-step tablet was placed on the test board, and a DLP exposure device (product name: "DE-1AH" by Hitachi Via Mechanics, Ltd.) with a wavelength of 405 nm, employing a semiconductor laser as the light source, was used for exposure at 20 mJ/cm². Next, the polyethylene terephthalate film was released and sprayed for 60 seconds with 1.0 wt % aqueous sodium carbonate at 30° C., the unexposed sections were removed, and then the number of steps of the step tablet was measured for the photocured film formed on the copper-clad laminate, to evaluate the photosensitivity of the photosensitive resin composition. The photosensitivity is indicated by the number of steps of the step tablet, with a higher step tablet step number representing higher photosensitivity.

<Evaluation of Adhesiveness>

The laminated test board was exposed with an energy dose for 17.0 steps remaining after development of the Hitachi 41-step tablet, with rendering data having a wiring pattern with a line width/space width ratio of 5/400-47/400 (units: μm) as the pattern for evaluation of adhesiveness. After developing treatment under the same conditions as for evaluation of the photosensitivity, an optical microscope was used to observe the resist pattern, and the adhesiveness (μm) was evaluated based on the smallest value of the line width with which peeling and twisting no longer occurred. A smaller numerical value indicates more satisfactory adhesiveness.

<Evaluation of Resolution>

The laminated test board was exposed with an energy dose for 17.0 steps remaining after development of the Hitachi 41-step tablet, with rendering data having a wiring pattern with a line width/space width ratio of 400/5-500/47 (units: μm) as the pattern for evaluation of resolution. After developing treatment under the same conditions as for evaluation of the photosensitivity, an optical microscope was used to observe the resist pattern, and the resolution (μm) was evaluated based on the smallest value of the space width with which the unexposed sections were completely removed. A smaller numerical value indicates more satisfactory resolution.

<Evaluation of Resist Shape>

The laminated test board was exposed with an energy dose for 17.0 steps remaining after development of the Hitachi 41-step tablet, with rendering data having a wiring pattern with a line width/space width ratio of 5/5-47/47 (units: μm) as the pattern for evaluation of the resist shape. After developing treatment under the same conditions as for evaluation of the photosensitivity, a Model S-2100A scanning electron microscope by Hitachi, Ltd. was used to observe the resist shape.

For the resist shape, a trapezoidal or inverted trapezoidal cross-sectional shape of the pattern causes inconveniences, such as failure to obtain a wiring pattern with the design width after etching or plating treatment, and therefore the cross-section of the pattern is preferably nearly rectangular. The resist shape was evaluated according to the following criteria.
A: Cross-sectional shape of resist pattern rectangular.
B: Cross-sectional shape of resist pattern slightly inverted trapezoidal, but without practical problems.
C: Cross-sectional shape of resist pattern inverted trapezoidal, with practical problems.

Also, since jagged edges of the resist skirt, known as mouse bites, and inconveniences such as loss of the wiring pattern can occur, more preferably no mouse bites are present. The results are shown in Table 3.

TABLE 3

|  | Example 1 | Example 2 | Example 3 | Comp. Ex. 1 | Comp. Ex. 2 | Comp. Ex. 3 |
| --- | --- | --- | --- | --- | --- | --- |
| Photosensitivity (ST steps/41) | 14.5 | 14.0 | 13.0 | 11.5 | 13.5 | 17.1 |
| Adhesiveness (μm) | 22 | 22 | 25 | 22 | 27 | 27 |
| Resolution (μm) | 35 | 35 | 35 | 35 | 40 | 40 |
| Pattern cross-sectional shape | A | A | A | A | B | B |
| Mouse bites | − | − | − | − | + | + |

As clearly seen in Table 3, Examples 1-3 that employed photosensitive resin compositions according to the invention satisfy all of the desired conditions including photosensitivity, resolution, adhesiveness of the formed resist pattern, and resist shape. In contrast, Comparative Example 1 had insufficient photosensitivity of the photosensitive resin composition, while Comparative Examples 2-3 had inferior adhesiveness, resolution and resist shapes.

The invention claimed is:

1. A photosensitive resin composition comprising a (A) binder polymer, a (B) photopolymerizing compound having ethylenic unsaturated bonds in the molecule, a (C) photopolymerization initiator and a (D) polymerization inhibitor, wherein the (C) photopolymerization initiator comprises an acridine compound, and the content of the (D) polymerization inhibitor is 20-100 ppm by weight.

2. A photosensitive resin composition according to claim 1, wherein the acridine compound includes a compound represented by the following formula (I):

$$\left[ \begin{array}{c} \text{(acridine structure)} \end{array} \right]_2 -R^1 \quad (I)$$

wherein $R^1$ represents a C2-20 alkylene, oxadialkylene or thiodialkylene group.

3. A photosensitive resin composition according to claim 1, wherein the (B) photopolymerizing compound having ethylenic unsaturated bonds in the molecule includes a compound represented by the following formula (II):

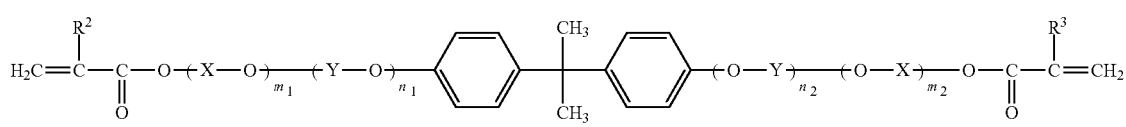

(II)

wherein $R^2$ and $R^3$ each independently represent hydrogen atom or a methyl group, X and Y each independently represent a C1-6 alkylene group, and $m_1$, $m_2$, $n_1$ and $n_2$ represent integers of 0-20 selected so that $m_1+m_2+n_1+n_2=0\text{-}40$.

4. A photosensitive resin composition according to claim 1, wherein the (B) photopolymerizing compound having ethylenic unsaturated bonds in the molecule includes a compound represented by the following formula (III):

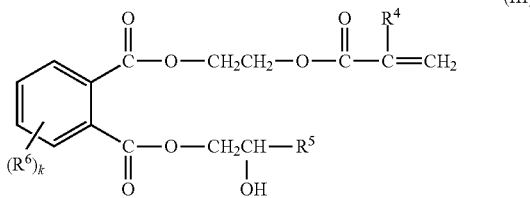

wherein $R^4$ represents hydrogen atom or a methyl group, $R^5$ represents hydrogen atom or a methyl or halogenated methyl group, $R^6$ represents C1-6 alkyl, a halogen atom or a hydroxyl group, k represents an integer of 0-4, and when k is 2 or greater, the multiple $R^6$ groups may be the same or different.

5. A photosensitive resin composition according to claim 1, wherein the (D) polymerization inhibitor comprises a compound having a phenolic hydroxyl group.

6. A photosensitive element comprising a support and a photosensitive resin composition layer composed of a photosensitive resin composition according to claim 1 formed on the support.

7. A resist pattern manufacturing method that comprises:
   a lamination step in which a photosensitive resin composition layer composed of a photosensitive resin composition according to claim 1 is laminated on a circuit-forming board,
   an exposure step in which prescribed sections of the photosensitive resin composition layer are irradiated with active light rays for photocuring of the exposed sections, and
   a developing step in which the sections other than the exposed sections of the photosensitive resin composition layer are removed from the circuit-forming board to form a resist pattern.

8. A resist pattern manufacturing method that comprises:
   a lamination step in which the photosensitive resin composition layer of a photosensitive element according to claim 6 is laminated on a circuit-forming board,
   an exposure step in which prescribed sections of the photosensitive resin composition layer are irradiated with active light rays for photocuring of the exposed sections, and
   a developing step in which the sections other than the exposed sections of the photosensitive resin composition layer are removed from the circuit-forming board to form a resist pattern.

9. The resist pattern manufacturing method according to claim 7, wherein the exposure step is a step in which the photosensitive resin composition layer is subjected to direct writing exposure with laser light for photocuring of the exposed sections.

10. A printed circuit board manufacturing method that comprises a step of etching or plating a circuit-forming board having a resist pattern formed by the manufacturing method according to claim 7.

11. The resist pattern manufacturing method according to claim 8, wherein the exposure step is a step in which the photosensitive resin composition layer is subjected to direct writing exposure with laser light for photocuring of the exposed sections.

12. A printed circuit board manufacturing method that comprises a step of etching or plating a circuit-forming board having a resist pattern formed by the manufacturing method according to claim 8.

* * * * *